United States Patent [19]

Abiru et al.

[11] 4,426,657
[45] Jan. 17, 1984

[54] SEMICONDUCTOR DEVICE AND METHOD FOR PRODUCING SAME

[75] Inventors: Akira Abiru, Yokohama; Masahiro Sugimoto, Yokosuka; Juro Inomata, Yokohama, all of Japan

[73] Assignee: Fujitsu Limited, Kawasaki, Japan

[21] Appl. No.: 234,196

[22] Filed: Feb. 13, 1981

[30] Foreign Application Priority Data

Feb. 13, 1980 [JP] Japan .................. 55-16334

[51] Int. Cl.³ ................ H01L 27/04; G11C 11/40
[52] U.S. Cl. .......................... 357/29; 357/52; 357/72; 357/84
[58] Field of Search ............. 357/52, 54, 72, 29, 357/84

[56] References Cited

U.S. PATENT DOCUMENTS

| | | | |
|---|---|---|---|
| 3,615,913 | 10/1971 | Shaw | 357/52 |
| 4,331,970 | 5/1982 | Yerman | 357/72 |
| 4,337,182 | 6/1982 | Needham | 357/72 |

FOREIGN PATENT DOCUMENTS

| | | | |
|---|---|---|---|
| 55-128851 | 10/1980 | Japan | 357/29 |
| WO80/02891 | 12/1980 | | 357/84 |

OTHER PUBLICATIONS

Brody et al., IBM Tech. Discl. Bulletin, vol. 22, No. 4, Sep. 1979, pp. 1460-1461.
Escott et al., IBM Tech. Discl. Bulletin, vol. 22, No. 11, Apr. 1980, p. 4850.

*Primary Examiner*—William D. Larkins

[57] ABSTRACT

A semiconductor device having a protective polyimide film layer for preventing α-rays from intruding into the device is provided. The polyimide film layer has incorporated therein a salient amount of finely divided filler particles, and is formed on the surface of at least a region wherein the semiconductor element is formed. The polyimide film layer is formed by coating the semiconductor substrate with a liquid polyimide or polyamic acid composition having incorporated therein the finely divided filler particles, according to a screen printing method.

6 Claims, 8 Drawing Figures

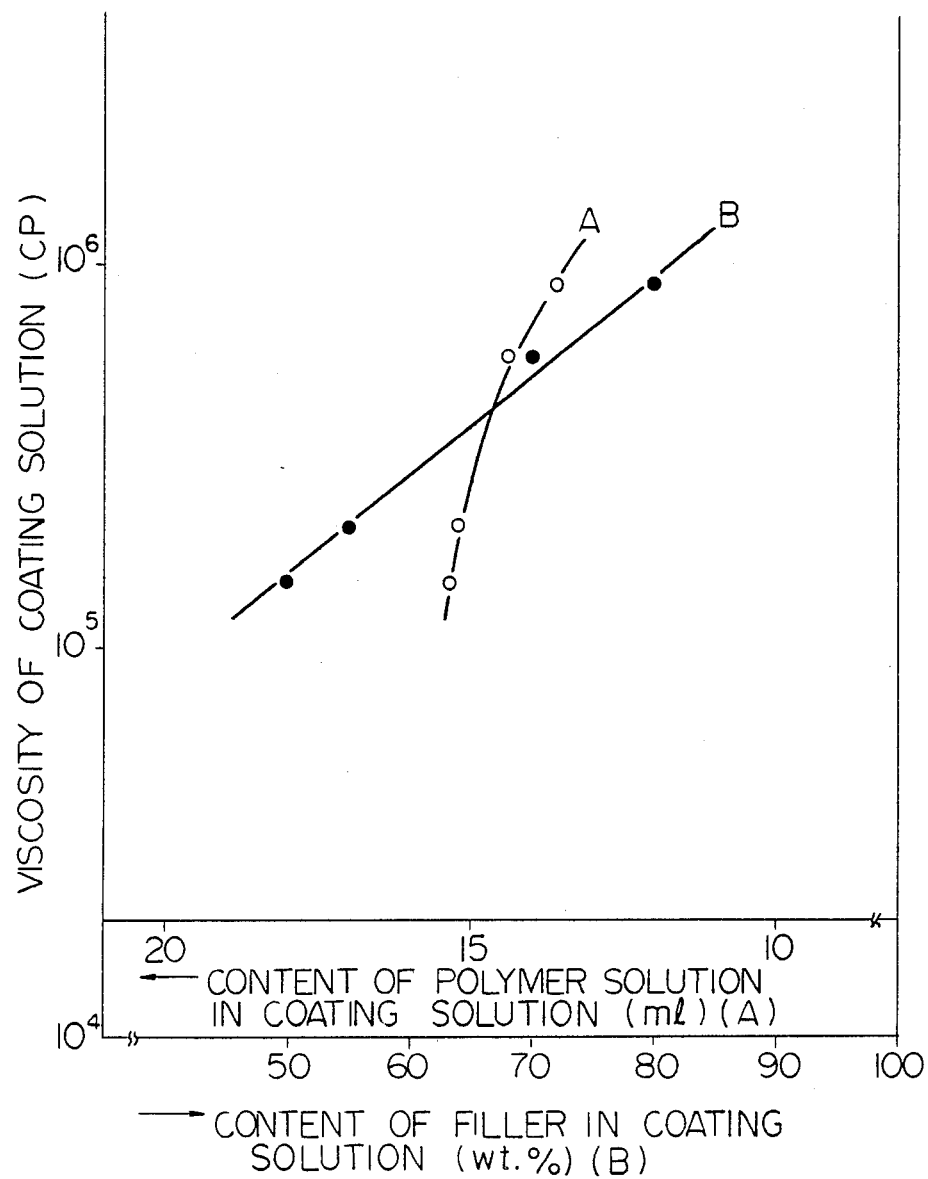

SEMICONDUCTOR DEVICE AND METHOD FOR PRODUCING SAME

BACKGROUND OF THE INVENTION

This invention relates to a semiconductor device, particularly a semiconductor device comprising a semiconductor element having the surface coated with an α-ray-insulating polyimide, and to a method for production of such a semiconductor device.

Semiconductor devices generally have a structure such that a semiconductor element is secured onto a support made of, for example, a ceramic or Kovar (an Fe-Ni-Co alloy) and this semiconductor element is sealed by wall and lid members made of, for example, a ceramic.

When the semiconductor element to be sealed is constructed by a high density integrated circuit, especially an MOS device or charge transfer device, degradation of characteristics, such as destruction of stored information, is caused by radiations from a surrounding structural member or sealing member, especially α-rays. Occurrence of this undesirable phenomenon is due to the fact that uranium (U) and thorium (Th), which are present in the natural world and produce α-rays as the result of radioactive decay, are contained in the ceramic material constituting the surrounding member, in a low-melting-point glass as the sealing member or in a solder comprised of lead and tin.

When α-rays thus produced intrude into the semiconductor element, pairs consisting of a positive hole and an electron, are generated and either the positive hole or the electron of each pair is injected into the active region of the semiconductor element to cause, for example, the above-mentioned destruction of stored information. Accordingly, it is important to prevent irradiation and intrusion of α-rays in the surface region of a semiconductor substrate.

The inventors have found that the undesirable intrusion of α-rays into a semiconductor element can be prevented or minimized by coating the surface of the semiconductor element with a polyimide film for blocking intrusion of the α-rays. In order for this polyimide film to exert this α-ray-blocking effect, the polyimide film should have a thickness of approximately 20 to 30 μm. When a spin coating method is adopted for formation of a polyimide film, if the speed of rotation is small, such a thickness can be obtained by performing the coating operation only once.

However, when the speed of rotation is small, as it is in this case, the thickness distribution in the wafer becomes non-uniform, with the result that a semiconductor element obtained from one wafer fails to have a uniform thickness of 20 to 30 μm. If the rotation speed is elevated to a level sufficient to make the thickness uniform, the thickness of the polyimide film formed by performing the coating operation only once is about 10 to about 15 μm at the largest. Therefore, in order to obtain a film having a thickness of 20 to 30 μm, it is necessary to conduct the coating operation at least two times. However, since the solvent used must be removed by a heat treatment after every coating operation, if the coating operation is repeated two times or more, the number of steps is inevitably increased.

Furthermore, in order to obtain a final product with the semiconductor element having such a polyimide film, a window for a bonding pad should be formed on the polyimide film to wire-connect the semiconductor element to an external circuit. For formation of such a window, an etching treatment is carried out by using, for example, a highly alkaline etchant containing hydrozine and ethylenediamine. A mask is necessary for this etching treatment, and in order to prevent the etchant from corroding the metal of the bonding pad, it is necessary to adopt a method in which a protecting film, comprised of, for example, phosphosilicate glass (PSG), is formed and etched in a controlled manner to leave a thin film in the pad portion and, in the succeeding step, the PSG film in the pad portion is removed leaving the polyimide, which has been formed in a separate step, as a mask by using another etchant.

The above-mentioned process for manufacturing a semiconductor device having a protective polyimide film layer will be illustrated by FIGS. 1A, 1B and 1C. Referring to FIG. 1A, a PSG film 3 is coated on a metal layer 2 of aluminum or the like formed as a bonding pad on a semiconductor substrate 1 on which a semiconductor element is formed, and then, the pad portion is etched in a controlled manner and thereafter a polyimide is coated thereon to form a polyimide film 4. Then, as shown in FIG. 1B, the polyimide film 4 is etched with a highly alkaline etchant by using a mask (not shown) to open a window 5. Thereafter, as shown in FIG. 1C, a window is formed in the PSG film 3 by a fluoric acid type etchant with the polyimide film 4 being as the mask. As is seen from the above description, a mask should be used for formation of a window on the polyimide film and the etching treatment should be conducted two times by using different etchants, with the result that the process becomes complicated.

As a means for eliminating the above-mentioned disadvantages, there is a method in which the screen printing technique is adopted.

This method is ordinarily utilized for patterning of wires in hybrid integrated circuits. However, if a layer of polyimide is coated in a thickness of 20 to 30 μm, since the viscosity of the polyimide is low, sagging of the pattern is readily caused. In the case where this polyimide undesirably covers the bonding pad portion, if the property test is carried out by using a test probe brought into contact with the bonding pad, the product may be judged as a defective product because of insufficient contact of the bonding pad though the formed semiconductor element. Furthermore, in this case, insufficient bonding is readily caused.

SUMMARY OF THE INVENTION

It is therefore a primary object of the present invention to provide a method in which the foregoing defects of the conventional methods are eliminated and a semiconductor device can be prepared through much simplified process steps, and also to provide a semiconductor device which is hardly influenced by α-rays.

In accordance with the first aspect of the present invention, there is provided a semiconductor device comprising a substrate having at least one semiconductor element formed therein, the surface of at least a region where the semiconductor element is formed being coated with a polyimide having incorporated therein finely divided filler particles.

In accordance with the second aspect of the present invention, there is provided a method for producing a semiconductor device comprising a substrate having at least one semiconductor element formed therein, which comprises coating the surface of at least a region of the substrate where the semiconductor element is formed, with a liquid polyimide or polyamic acid composition having incorporated therein finely divided filler particles, according to a screen printing method.

DESCRIPTION OF THE PREFERRED EMBODIMENTS

Figure 1A:
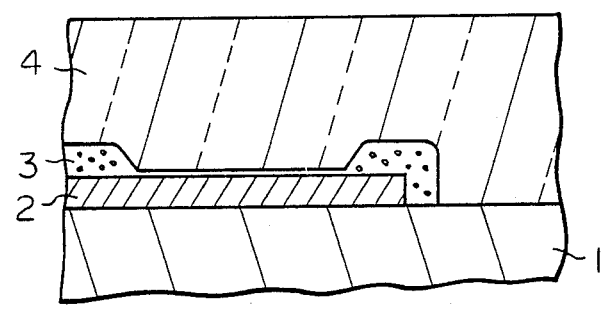
FIGS. 1A, 1B and 1C are sectional views illustrating the steps of manufacturing a semiconductor device having a protective polyimide film layer, as hereinbefore mentioned.

In the present invention, there is used a liquid polyimide or polyamic acid composition as the coating material for forming the α-ray-insulating polyimide film layer. The liquid polyimide or polyamic acid composition may comprise a polyimide or polyamic acid solution having incorporated therein 30 to 80% by weight, based on the total weight of the composition, of a finely divided filler particle. The liquid polyimide or polyamic acid composition usually has a viscosity of from about 50,000 to 1,000,000 centipoises. The polyimide or polyamic acid solution used is usually comprised of, based on the weight of the solution, 10 to 40% by weight of polyimide or polyamic acid and 60 to 90% by weight of a solvent. The solvent used is not particularly limited, provided that polyimide or polyamic acid is soluble therein. The solvent used includes, for example, a mixed solvent composed of N-methyl-2-pyrrolidone and xylene or of N-methyl-2-pyrrolidone, xylene and N,N-dimethylacetamide. The polyimide and polyamic acid used may possess any molecular weight and may be either solid or liquid. The polyamic acid is converted into polyimide when the polyamic acid coated on a semiconductor element is cured.

The filler to be incorporated in the polyimide or polyamic acid solution should be of a high purity so that it does not substantially produce an appreciable amount of α-rays, and further should be insoluble in the polyimide or polyamic acid solution. Such a filler includes, for example, silica ($SiO_2$), alumina ($Al_2O_3$), trisilicon tetranitride ($Si_3N_4$), silicon (Si) and silicon carbide (SiC). The filler may be in a finely divided form having an average particle size of from 1 to 10 microns, more preferably from 3 to 5 microns. Of these fillers, silicon (Si) is preferable because it has, in addition to the intended advantage that it imparts a suitable viscosity to the polyamic acid or polyimide solution, an advantage such that the resulting polyimide film layer exhibits an improved α-ray insulative property as compared with the polyimide film layers formed from the other fillers.

The polyimide or polyamic acid solution used may preferably possess a viscosity of less than approximately 15,000 cp. The liquid polyimide or polyamic acid solution may possess a viscosity of the order of from $10^4$ to $10^7$ cp. The viscosity of the liquid polyimide or polyamic acid solution varies depending upon the content of the filler and the content of the polymer. For example, when a polyamic acid solution composed of 16.5% by weight of polyamic acid and 83.5% by weight of a solvent (N-methyl-2-pyrrolidone/xylene) is incorporated with a finely divided silicon powder having particle sizes ranging from about 1 to 10 microns, the resulting liquid composition exhibits a viscosity shown in FIG. 4. In FIG. 4, the ordinate signifies the viscosity (in cp) of the liquid composition. The upper abscissa signifies the content (in ml) of the polyamic acid solution in the liquid composition in the case where the solution is incorporated with 30 g of the filler, and the upper abscissa corresponds to curve A. The lower abscissa signifies the content (in wt. %) of the filler in the liquid composition and corresponds to curve B. The viscosity shown in FIG. 4 was determined at 19° C. by using a Brookfield viscometer at a revolution speed of 10 rpm.

Figure 2:
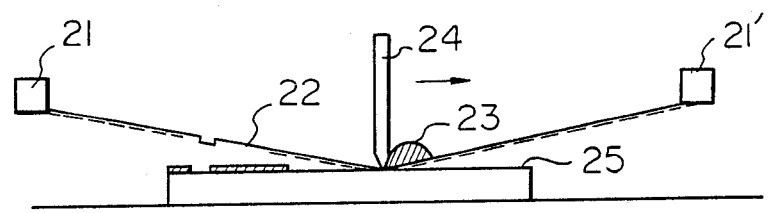
FIG. 2 is a diagram illustrating the screen printing method adopted in carrying out the method of the present invention.

The method of forming an α-ray insulative polyimide film layer on the surface of at least a region where the semiconductor element is formed will now be described with reference to one embodiment illustrated in FIG. 2, which figure illustrates diagramatically the screen printing method adopted in the present invention.

The coating liquid composition usually is coated on the surface of a semiconductor element, excepting certain parts, for example, the bonding pad portion, according to the screen printing method to form an α-ray insulating protective coating film. Referring to FIG. 2, the above-mentioned coating liquid composition 23 is placed on a stencil screen 22 stretched between a printing frame 21 and 21', and a squeegee 24 is then placed on the stencil screen 22 and pressure is applied, whereby the stencil screen 22 is brought into contact with a substrate 25. In this state, when the squeegee 24 is moved in a direction indicated by an arrow, pressure is imposed on the coating liquid composition 23 according to the moving speed and angle of the squeegee 24, whereby the coating composition 23 is forced into the stencil screen 22 and brought into contact with the substrate 25 through meshes of the stencil screen 22 to form a desired pattern of the coating composition on the substrate 25.

The thickness of the coated liquid composition varies depending upon the viscosity of the liquid composition. For example, when the liquid composition illustrated with reference to FIG. 4 is coated by a screen printing method wherein a stencil screen of 200-325 meshes is used so that the distance between the upper surface of the stencil screen to the surface of the substrate is approximately 90 microns, the resulting coating thickness is in the range of from approximately 30 to 40 microns if the viscosity is 15 centipoises and the coating thickness is in the range of from approximately 40 to 50 microns if the viscosity is 50 centipoises.

The coating film layer may be cured, i.e., heat-treated, for example, at a temperature of 150° to 450° C. under a normal pressure. Thus, a protective polyimide film having a desired thickness sufficient for insulating the semiconductor element from α-rays is formed on the surface of the element. When a polyamic acid composition is coated, the polyamic acid is converted into polyimide by curing. It is to be noted that, although the thickness of the coating film is reduced by curing, the cured film advantageously retains at least about 95% of the original thickness when the curing is conducted, for example, at 450° C. for 30 minutes. In contrast, if a coating film, formed in a manner similar to the above but from a liquid composition having no filler incorporated therein, is cured under the same conditions as mentioned above, the cured film retains only about 50 to 70% of the original thickness. The thickness of the cured film of the present invention may be generally in the range of from about 20 to 100 microns.

Thus, a protective polyimide film of the desired thickness can be formed by one single coating operation according to the method of the present invention. Furthermore, the coating film of the present invention is advantageous over the comparative coating film containing no filler in that the former film can be cured at a lower temperature or for a shorter period of time.

The cured polyimide film is usually comprised of, based on the weight of the polyimide film, 10 to 50% by weight of polyimide and 50 to 90% by weight of the fimely divided filler particles.

Figure 1B:
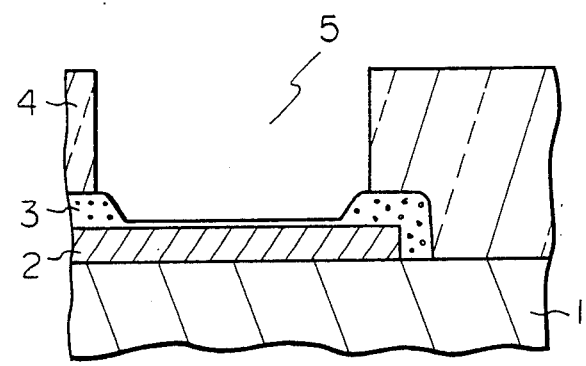
Figure 1C:
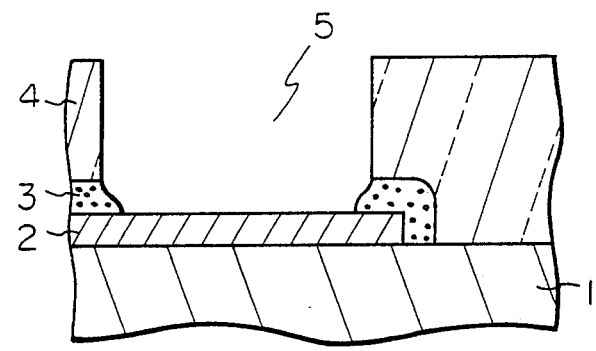

The processing of the bonding pad portion will now be described using FIGS. 3A, 3B and 3C in a manner similar to that illustrated hereinbefore with reference to FIGS. 1A, 1B and 1C.

Figure 3A:
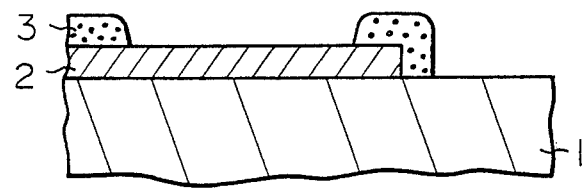
FIGS. 3A, 3B and 3C are sectional views illustrating the steps of manufacturing a semiconductor device having a protective polyimide film layer according to one embodiment of the method of the present invention; and, FIG. 4 is a graph showing the dependence of the viscosity of a liquid polyamic acid composition upon the content of a filler in the composition and upon the content of a polyamic acid solution in the composition.

As shown in FIG. 3A, a window is formed in advance on a portion to be bonded to a wire in a phosphosilicate (PSG) film 3 formed on a substrate 1 and a bonding pad 2.

A filler-containing polyimide film 4' is then formed according to the above-mentioned screen printing method. Since the polyimide film 4' has a high viscosity of, for example, at least about 50,000 or 100,000 cp as pointed out hereinbefore, even if the thickness of the coated polyimide film 4' is about 30 μm, undesirable sagging is not caused at all. Accordingly, when the characteristics of the semi-conductor device are checked by using a test probe, contact of the test probe with the device is not at all prevented by the polyimide film. Furthermore, in the above-mentioned screen printing method, there is no need of etching the polyimide film 4', and therefore, both the steps of leaving a thin PSG film as a protective film in the portion to be bonded to a wire and removing this protective film after etching of the polyimide film can be omitted. Accordingly, the manufacturing process steps can be remarkably simplified according to the present invention, as compared with the steps in the conventional methods.

Figure 3B:
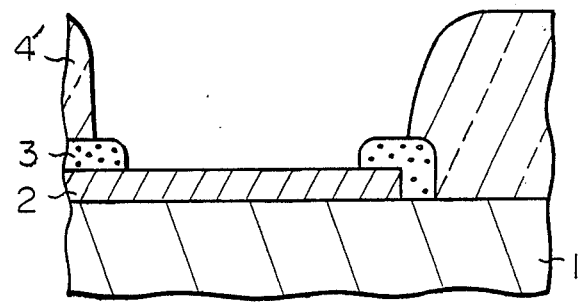
Figure 3C:
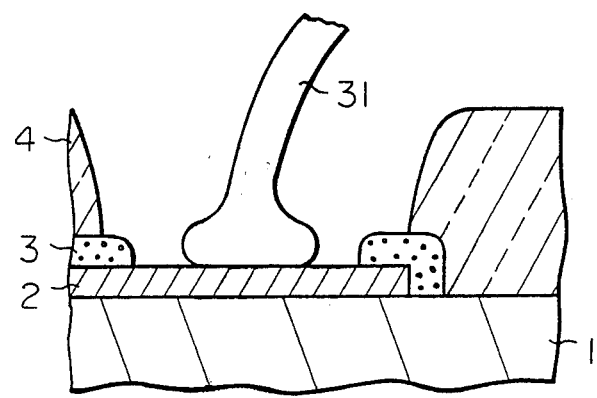

After the polyimide film 4' is formed as shown in FIG. 3B, the heat treatment is carried out in the same manner as described above and, as shown in FIG. 3C, a wire 31 is bonded to the predetermined portion.

We claim:

1. A semiconductor device comprising a substrate having at least one semiconductor element for forming an integrated circuit, said substrate being surrounded by other members of said semiconductor device, the surface of at least a region of said substrate where each said semiconductor element is formed being coated at least in part with a polyimide film having incorporated therein finely divided silicon particles of high purity, wherein each said semiconductor element is protected by said film from alpha radiation from any of said other members.

2. A semiconductor according to claim 1, wherein the polyimide film is comprised of, based on the weight of the polyimide film, 10 to 50% by weight of polyimide and 50 to 90% by weight of the finely divided silicon particles.

3. A semiconductor device according to claim 1 or 2, wherein the polyimide film has a thickness of about 20 to 100 microns.

4. A semiconductor device according to claim 1 or 2, wherein the finely divided silicon particles have an average particle size of about 1 to 10 microns.

5. The device of claim 1 or 2, comprising a plurality of the semiconductor elements.

6. The device of claim 3, comprising a plurality of the semiconductor elements.

* * * * *

UNITED STATES PATENT AND TRADEMARK OFFICE
CERTIFICATE OF CORRECTION

PATENT NO. : 4,426,657

DATED : 17 January 1984

INVENTOR(S) : Abiru et al

It is certified that error appears in the above-identified patent and that said Letters Patent is hereby corrected as shown below:

Col. 2, after line 9, insert a 10th line --Attorney, Agent or Firm—Staas & Halsey--.

Signed and Sealed this

Twenty-seventh Day of November 1984

[SEAL]

Attest:

Attesting Officer

GERALD J. MOSSINGHOFF

Commissioner of Patents and Trademarks